(12) United States Patent
Nadarajan et al.

(10) Patent No.: US 10,725,107 B2
(45) Date of Patent: Jul. 28, 2020

(54) BRUSHLESS SYNCHRONOUS GENERATOR STATOR WINDING FAULT

(71) Applicant: ROLLS-ROYCE plc, London (GB)

(72) Inventors: Sivakumar Nadarajan, Singapore (SG); Amit Gupta, Singapore (SG); Vaiyapuri Viswanathan, Singapore (SG); Chandana Gajanayake, Singapore (SG)

(73) Assignee: ROLLS-ROYCE plc, London (GB)

( * ) Notice: Subject to any disclaimer, the term of this patent is extended or adjusted under 35 U.S.C. 154(b) by 307 days.

(21) Appl. No.: 15/702,182

(22) Filed: Sep. 12, 2017

(65) Prior Publication Data

US 2018/0095134 A1 Apr. 5, 2018

(30) Foreign Application Priority Data

Oct. 5, 2016 (GB) .................................. 1616900.5

(51) Int. Cl.
*G01R 31/34* (2020.01)
*G06F 16/28* (2019.01)
*H02P 29/024* (2016.01)
*H02P 9/10* (2006.01)
*H02P 101/25* (2016.01)
*H02P 103/20* (2016.01)
*F02C 3/04* (2006.01)

(52) U.S. Cl.
CPC ......... *G01R 31/346* (2013.01); *G01R 31/343* (2013.01); *G06F 16/285* (2019.01); *H02P 9/107* (2013.01); *H02P 29/0243* (2016.02); *F02C 3/04* (2013.01); *H02P 2101/25* (2015.01); *H02P 2103/20* (2015.01)

(58) Field of Classification Search
None
See application file for complete search history.

(56) References Cited

U.S. PATENT DOCUMENTS 5,049,815 A * 9/1991 Kliman ................ G01R 31/343
324/545
7,539,549 B1 * 5/2009 Discenzo ............ F04D 15/0077
324/765.01
7,592,772 B2 9/2009 Nandi et al.
(Continued)

FOREIGN PATENT DOCUMENTS

EP 2469703 A2 6/2012
EP 2995967 A1 3/2016
WO 2011/006528 A1 1/2011

OTHER PUBLICATIONS

Penman J et al "The Detection of Stator and Rotor Winding Short Circuits in Synchronous Generators by Analysing Excitation Current Harmonics" Opportunities and Advances in International power generation pp. 137-142 (Year: 1996).*
(Continued)

*Primary Examiner* — Gregory J Toatley, Jr.
*Assistant Examiner* — Brandon J Becker
(74) *Attorney, Agent, or Firm* — Oliff PLC

(57) ABSTRACT

A method of classifying a stator winding fault in a brushless synchronous generator includes measuring an electrical parameter of the stator winding and classifying the fault by calculating positive or negative sequence harmonics of the parameter and comparing one or more harmonic component to a threshold.

17 Claims, 10 Drawing Sheets

(56) References Cited

U.S. PATENT DOCUMENTS

| | | | |
|---|---|---|---|
| 8,928,165 B2 | 1/2015 | Vasak et al. | |
| 2009/0091289 A1 | 4/2009 | Nandi et al. | |
| 2012/0326881 A1 | 12/2012 | Desabhatla | |
| 2013/0338939 A1* | 12/2013 | Nandi | G01R 31/343 702/38 |
| 2015/0198655 A1* | 7/2015 | Viswanathan | G01R 31/343 324/762.07 |
| 2016/0266208 A1* | 9/2016 | Athikessavan | G01R 31/346 |
| 2017/0102425 A1* | 4/2017 | Hao | G01R 31/72 |

OTHER PUBLICATIONS

Sottile, J. et al. "Condition Monitoring of Brushless Three-Phase Synchronous Generators With Stator Winding or Rotor Circuit Deterioration." IEEE Transactions on Industry Applications, vol. 42, pp. 1209-1215, 2006.

Iosif Szeidert, O. P. et al. "Considerations Regarding the Flux Estimation in Induction Generator with Application at the Control of Unconventional Energetic Conversion Systems." Department of Automation and Applied Informatics, Faculty of Automation and Computer Sciences, "Politehnica" University from Timisoara, Av. V. Parvan.

Willams, R.H. et al. "The use of virtual flux estimation in aerospace starter-generator systems," Power Electronics, Electrical Drives, Automation and Motion (SPEEDAM), 2012 International Symposium, 2012, pp. 426-431.

Penman, J. et al. "The Detection of Stator and Rotor Winding Short Circuits in Synchronous Generators by Analysing Excitation Current Harmonics." Opportunities and Advances in International Power Generation, pp. 137-142, 1996.

R.R., Oliveira et al. "Three-Phase Synchronous Generators Performance with Unbalanced and Non-Linear Loading—Analytical and Experimental Analysis." Industrial Electronics, IEEE International Symposium, vol. 3 ,pp. 1744-1749, Jul. 2006.

Kumar et al. "Modified winding function approch to stator fault modeling of synchronous generator." 12th IEEE International Conference on Control and Automation (ICCA), pp. 161-166, Jun. 2016.

Briz et al. "Stator winding fault diagnostics of induction machines operated from inverters and soft-starters usuing high frequency negative-sequence currents." IEEE Transactions on Industry Applications, vol. 15, Issue 5, pp. 1637-1646, 2008.

Boileau et al. "Stator winding inter-turn fault detection using control voltages demodulation." IEEE Transportation Electrification Conference and EXPO (ITEC), pp. 1-6, 2012.

Feb. 9, 2017 Search Report issued in British Application No. 1616900.5.

Feb. 12, 2018 Search Report issued in European Patent Application No. 17190386.

* cited by examiner

Fig 14: Magnitude of 5th harmonic positive sequence flux under healthy and various degrees of winding short circuit with increasing fault severity Fig 15: Magnitude of 5th harmonic positive sequence flux under healthy and various degrees of load unbalance in three phase

US 10,725,107 B2

BRUSHLESS SYNCHRONOUS GENERATOR STATOR WINDING FAULT

The present disclosure concerns a brushless synchronous generator, particularly a method to classify stator winding faults in such a generator.

The brushless synchronous generator (BLSG) is widely used in aircraft and marine vessels for onboard power generation and it is also used as a shaft generator in energy efficient hybrid propulsion systems for marine vessels. The brushless excitation offers increased reliability and reduced maintenance requirements for the generator.

According to a first aspect there is provided a method of classifying a stator winding fault in a brushless synchronous generator comprising steps to:

measure an electrical parameter of the stator winding;

classify the fault by calculating positive or negative sequence harmonics of the parameter and comparing one or more harmonic component to a threshold.

Advantageously the method enables stator winding faults to be distinguished from load unbalance faults.

The parameter may comprise electrical flux and the step of classifying the fault may comprise:

calculating the third, fifth and seventh positive sequence harmonic components of the flux;

comparing each harmonic component to a threshold; and classifying the stator winding fault if at least two of the harmonic components exceed their respective thresholds.

Otherwise classifying the fault as a load unbalance.

The parameter may comprise terminal voltage and the step of classifying the fault may comprise:

calculating the fifth positive sequence harmonic component (fifth harmonic component) of the terminal voltage;

comparing the fifth harmonic component to a threshold; and classifying the stator winding fault if the fifth harmonic component exceeds the threshold.

Otherwise classifying the fault as a load unbalance.

The parameter may comprise current and the step of classifying the fault may comprise:

calculating positive and negative harmonic sequence components of the current;

comparing each sequence to a threshold range; and classifying the stator winding fault if (i) neither of the sequences deviates from the threshold range and (ii) magnitude of measured exciter field current or exciter field voltage increases.

Where the parameter comprises terminal voltage it may comprise terminal voltage of the stator winding. Alternatively the parameter may comprise terminal voltage of each phase of the stator winding.

The step of classifying the fault may comprise distinguishing the stator winding fault from a load unbalance. Advantageously appropriate mitigation or recovery action can be taken to remedy or manage the classified fault.

The stator winding fault may comprise any one of a turn-to-turn short circuit; an inter-turn short circuit; a coil-to-coil short circuit; a phase-to-phase fault; and a phase-to-ground fault.

The skilled person will appreciate that except where mutually exclusive, a feature described in relation to any one of the above aspects may be applied mutatis mutandis to any other aspect. Furthermore except where mutually exclusive any feature described herein may be applied to any aspect and/or combined with any other feature described herein.

Embodiments will now be described by way of example only, with reference to the Figures, in which.

Figure 1:
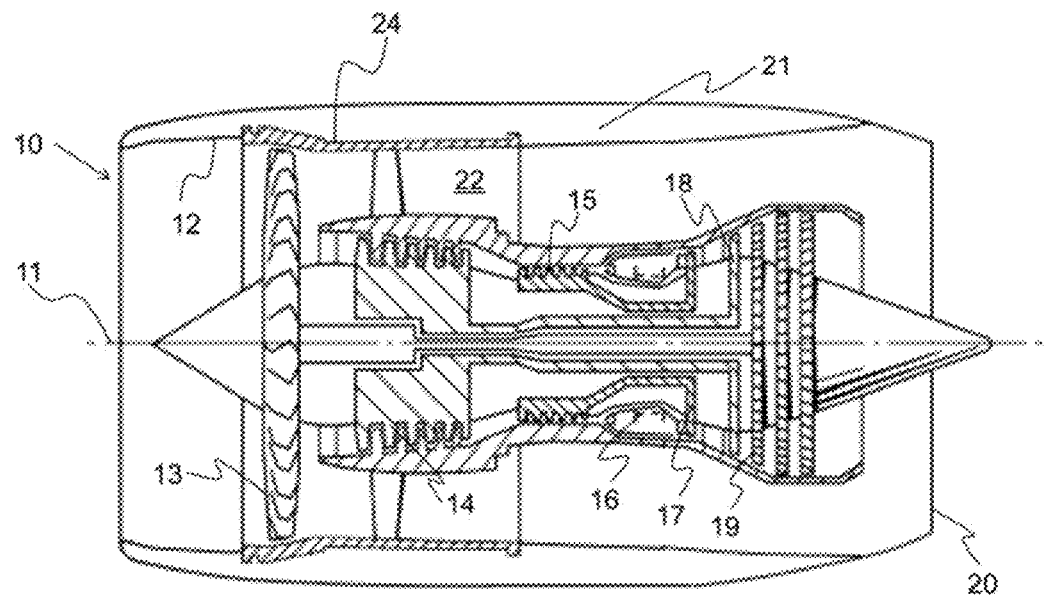
FIG. 1 is a sectional side view of a gas turbine engine.

With reference to FIG. 1, a gas turbine engine is generally indicated at 10, having a principal and rotational axis 11. The engine 10 comprises, in axial flow series, an air intake 12, a propulsive fan 13, an intermediate pressure compressor 14, a high-pressure compressor 15, combustion equipment 16, a high-pressure turbine 17, an intermediate pressure turbine 18, a low-pressure turbine 19 and an exhaust nozzle 20. A nacelle 21 generally surrounds the engine 10 and defines both the intake 12 and the exhaust nozzle 20.

The gas turbine engine 10 works in the conventional manner so that air entering the intake 12 is accelerated by the fan 13 to produce two air flows: a first air flow into the intermediate pressure compressor 14 and a second air flow which passes through a bypass duct 22 to provide propulsive thrust. The intermediate pressure compressor 14 compresses the air flow directed into it before delivering that air to the high pressure compressor 15 where further compression takes place.

The compressed air exhausted from the high-pressure compressor 15 is directed into the combustion equipment 16 where it is mixed with fuel and the mixture combusted. The resultant hot combustion products then expand through, and thereby drive the high, intermediate and low-pressure turbines 17, 18, 19 before being exhausted through the nozzle 20 to provide additional propulsive thrust. The high 17, intermediate 18 and low 19 pressure turbines drive respectively the high pressure compressor 15, intermediate pressure compressor 14 and fan 13, each by suitable interconnecting shaft.

Other gas turbine engines to which the present disclosure may be applied may have alternative configurations. By way of example such engines may have an alternative number of interconnecting shafts (e.g. two) and/or an alternative number of compressors and/or turbines. Further the engine may comprise a gearbox provided in the drive train from a turbine to a compressor and/or fan.

In a synchronous generator a DC current is provided for a field winding (or coil) mounted on a rotor, so as to produce a rotor magnetic field. The rotor is then rotated about its axis, e.g. by external means. Thus, sometimes the rotor magnetic field is referred to as a rotating magnetic field. A stator is provided with a stator winding (or coil). As the rotor is rotated the rotating magnetic field induces a voltage (an electromotive force) in the stator winding. Typically the stator winding has a plurality of armatures, whereby the rotating magnetic field induces respectively different voltages in each arm at different parts of the cycle. Thus, the multi-armature stator winding will generate a multi-phase (or polyphase) output in accordance with the number of armatures and the spatial relationship between each armature and the rotating magnetic field.

The DC current can be provided to the rotor field winding by means of brushes and slip rings. However, in a brushless synchronous generator, the DC current is provided by a supply circuit mounted on the rotor itself. The supply circuit is typically an AC signal rectifying circuit, for supplying a rectified signal to the rotor field winding. Typically, the supply circuit is provided with an AC signal from an exciter winding, also located on the rotor. The exciter winding has a voltage (an electromotive force) induced in it by an exciter field winding located on the stator. The exciter field winding is supplied with a DC current. Thus, as the rotor is rotated, the voltage is induced in the exciter winding. Typically, the exciter winding includes a plurality of armatures, thereby supplying the AC signal rectifying circuit with a multiphase AC signal.

Figure 2:
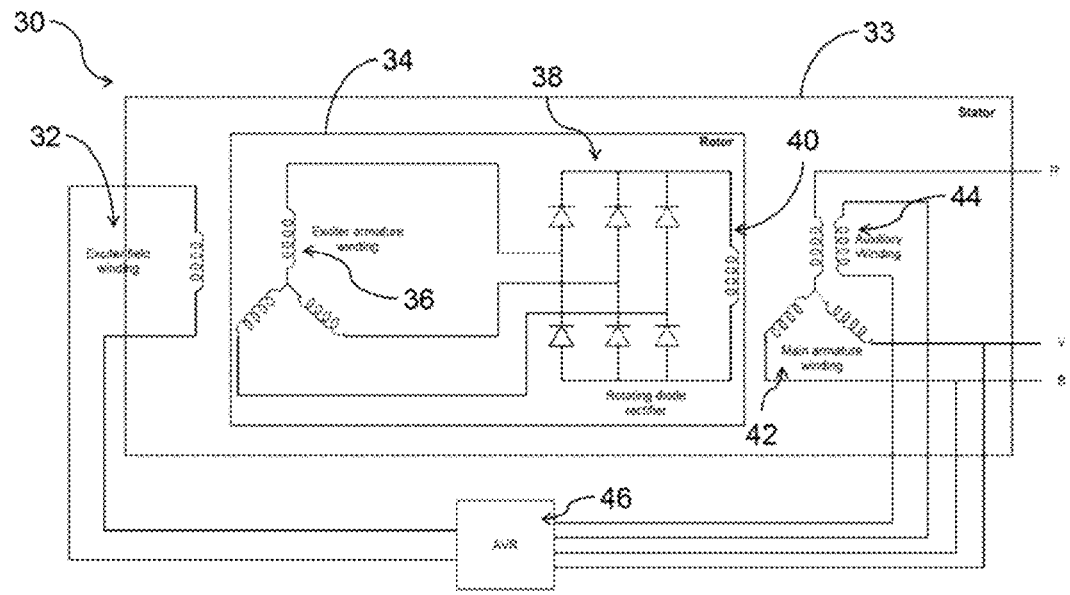
FIG. 2 shows a brushless synchronous generator.

A brushless synchronous generator 30 is shown in FIG. 2. The generator 30 includes an exciter field winding 32 located on a stator 33. Rotor element 34 includes an exciter armature winding 36. Armature winding 36 typically includes a plurality of armatures, so as to output a multi-phase (or polyphase) AC signal. For example, in FIG. 2 exciter armature winding 36 includes three armatures, each generating a respective phase of the overall signal output by the exciter armature winding 36. In other words exciter armature winding 36 outputs a three-phase AC signal.

Each phase of the AC signal is fed to a respective rectifying sub-circuit (or branch) of an AC rectifying circuit 38. AC rectifying circuit 38 is mounted on rotor 34, and may thus be referred to as a rotating diode rectifier (circuit), and the individual diodes therein may be referred to as rotating diodes.

The rectified outputs from each branch of the AC rectifying circuit 38 combine to provide a rectified output signal to the main field winding 40 located on the rotor 34. Rotation of the rotor 34 induces a current in the stator main armature winding 42 located on the stator 33. The main armature of the stator winding 42 typically includes a plurality of armatures, thereby generating a multiphase output signal. For example, in FIG. 2 stator winding 42 includes three armatures, resulting in a three phase output signal. The output is used to power a load (not shown).

An auxiliary winding 44 is also shown on the stator 33. The auxiliary winding 44, the exciter field winding 32 and two phases of the stator winding 42 are each coupled to an automatic voltage regulator 46. The automatic voltage regulator 46 measures the voltage across two phases and then compares the measured voltage to a reference value for terminal voltage. The exciter field voltage is then adjusted depending on the error between the measured and reference voltages.

Brushless synchronous generators 30 may experience a number of different faults including stator winding faults and load unbalance. In order to effectively manage the consequences of BLSG 30 faults it is necessary to be able to accurately distinguish between different fault types. The signatures of load unbalance and stator winding faults can often coincide or overlap. The present method identifies and classifies stator winding faults and distinguishes them from load unbalance faults.

Stator winding faults include a turn-to-turn short circuit; an inter-turn short circuit; a coil-to-coil short circuit; a phase-to-phase fault; and a phase-to-ground fault. A turn is a single loop of a helical winding, having any cross-sectional shape. Thus a turn-to-turn short circuit is one where one loop of a winding comes into electrical contact with another loop of the same winding and an inter-turn short circuit is where part of one loop contacts another part of the same loop. A coil is a set of coils formed in a continuous spiral. A coil-to-coil short circuit is one where two or more coils are positioned in the same stator slots and part of one coil contacts part of an adjacent one.

The present method comprises a first step to measure an electrical parameter of the stator winding 42. It comprises a second step to classify the fault by calculating harmonics of the parameter and comparing one or more of the harmonic components to a threshold.

In a first embodiment the first step comprises measuring or estimating stator flux. Any conventional method of estimating stator flux of each phase of the BLSG 30 may be used. For example stator flux $\Psi$ may be estimated from $\int(u_s - R_{se}i_s)dt$ where $u_s$ is the stator voltage, $R_{se}$ is the stator resistance estimator's parameter and $i_s$ is the stator current. Alternatively the stator current $i_s$ may be estimated instead of measured to reduce errors. The stator flux LP may alternatively be estimated from $L_M(i_s + i_r)$ where $L_M$ is the magnetisation inductance, $i_s$ is the stator current and $i_r$ is the rotor current. In another alternative virtual flux estimation may be used.

Figure 3:
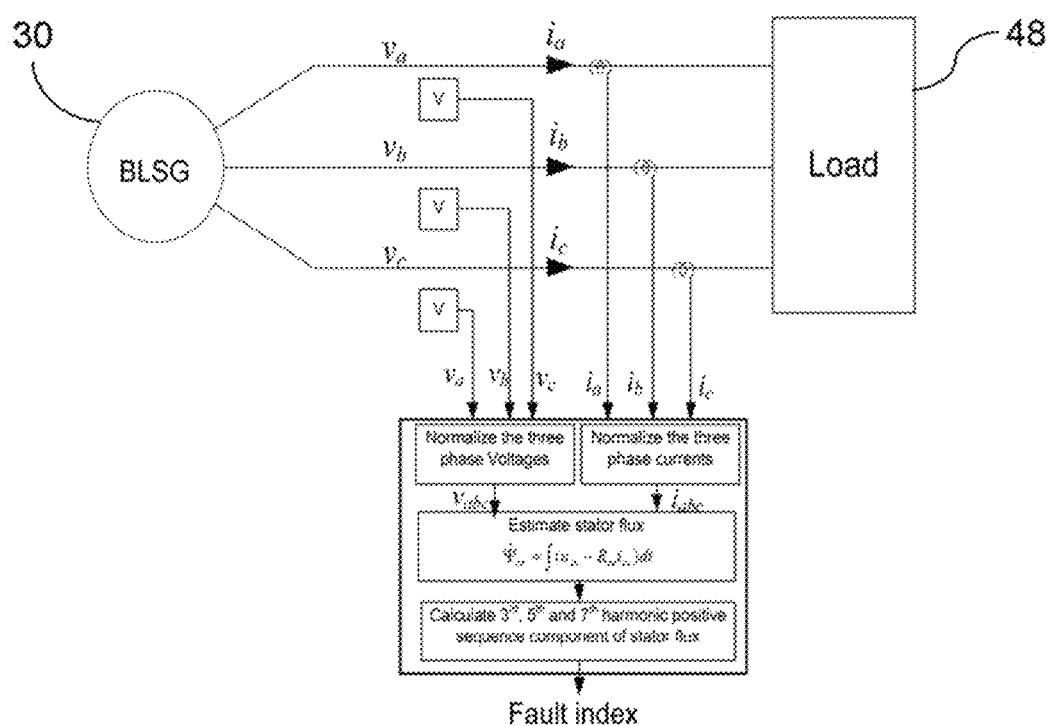
FIG. 3 shows a block diagram of a first embodiment.

FIG. 3 shows a schematic view of a BLSG 30 coupled to a load 48. Current and voltage measurements are taken from each of the three phases, shown with suffixes a, b, c. The voltages and currents are normalised and then used to estimate the stator flux $\Psi$ as described above.

Figure 4:
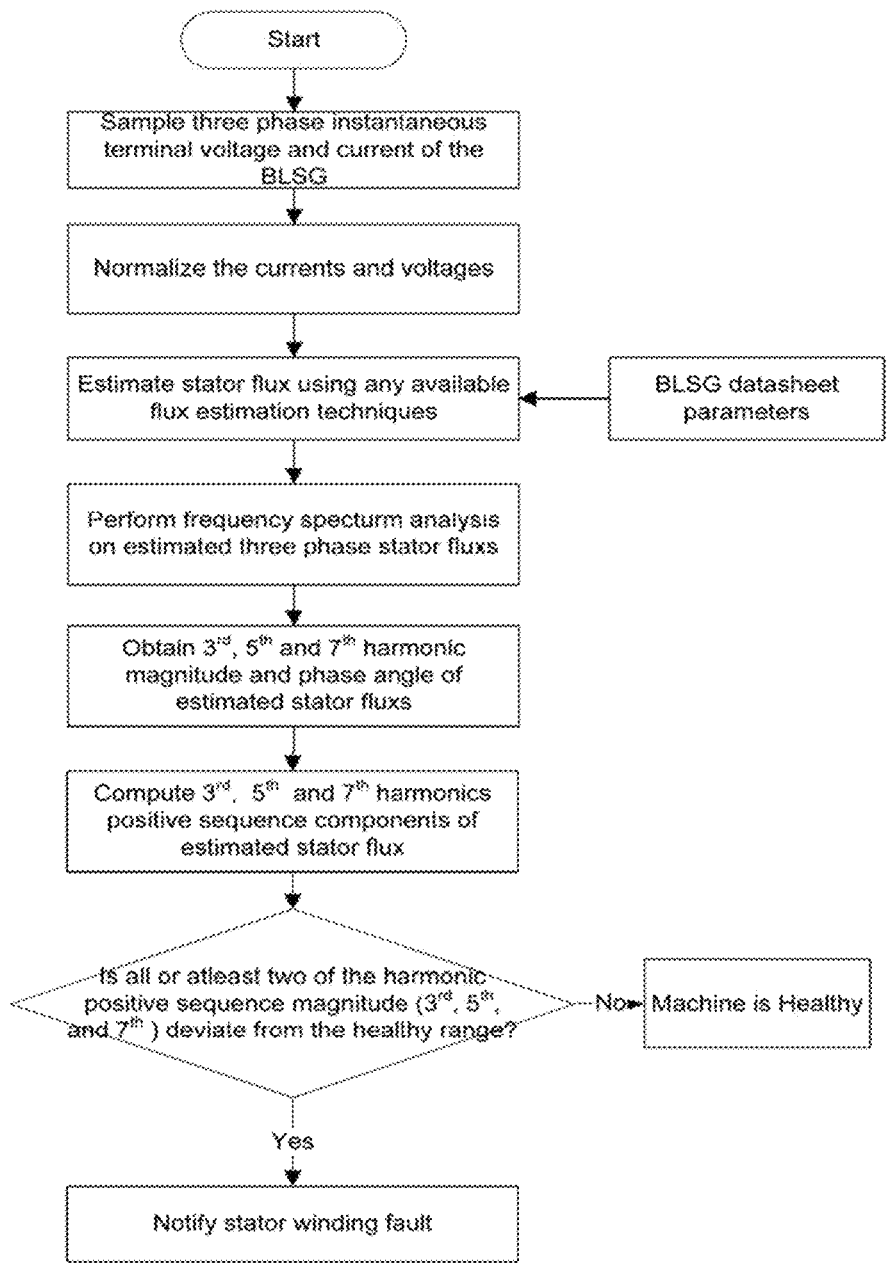
FIG. 4 is a flow chart of a first embodiment of the method.
Figure 5:
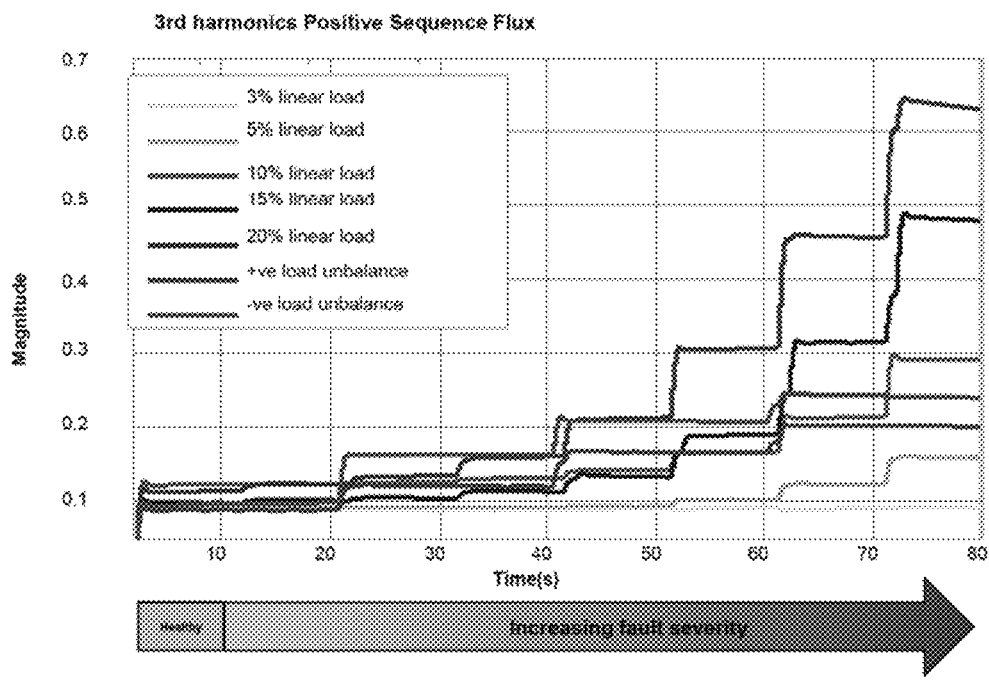
FIG. 5 is a plot of third harmonic positive sequence flux under stator winding short circuit and load unbalance.
Figure 6:
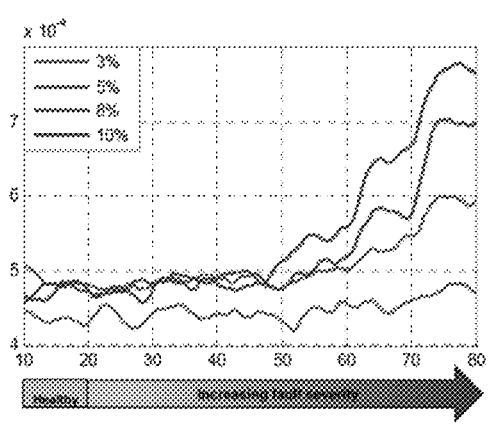
FIG. 6 is a plot of fifth harmonic positive sequence flux under stator winding short circuit and load unbalance.
Figure 6:
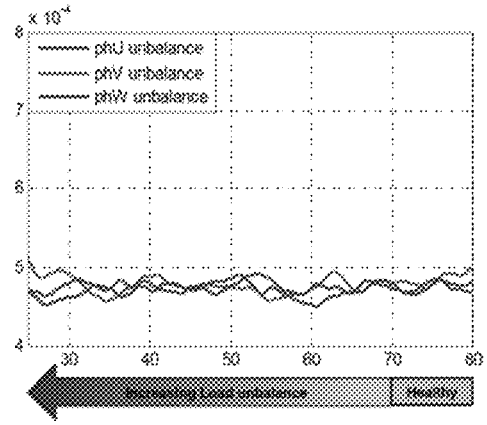
Figure 7:
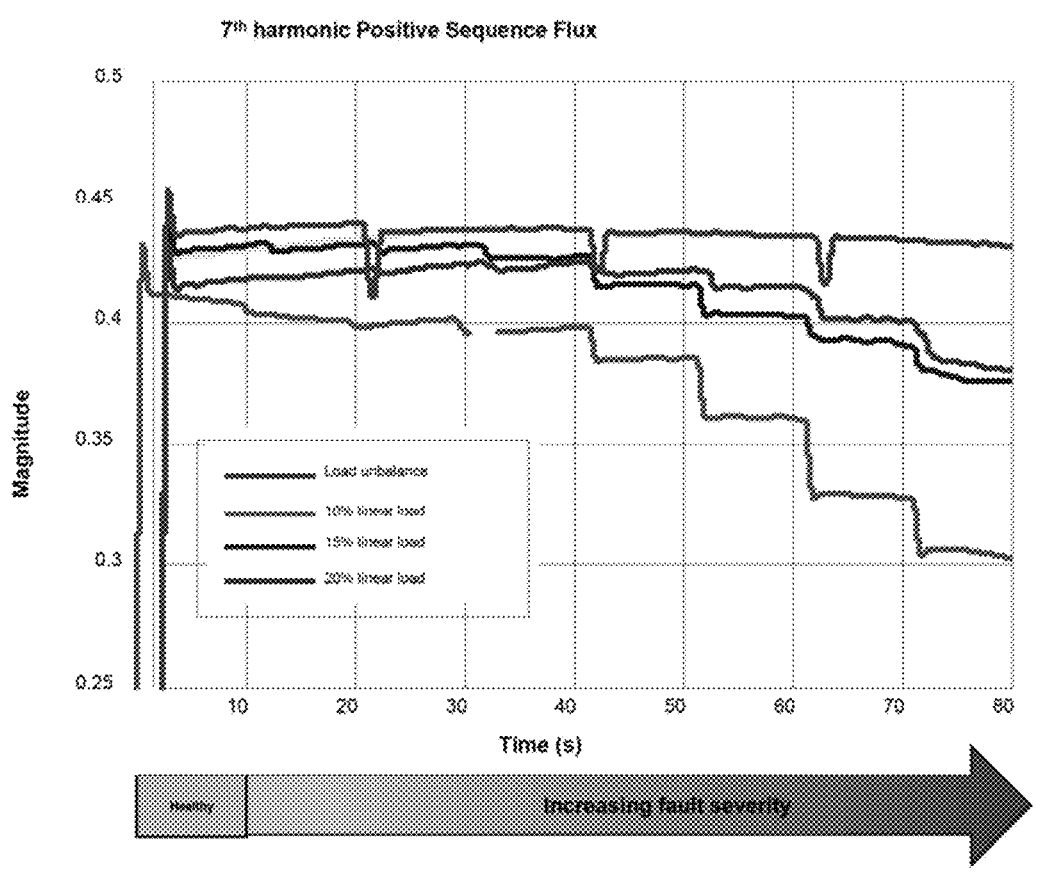
FIG. 7 is a plot of seventh harmonic positive sequence flux under stator winding short circuit and load unbalance.

The second step comprises calculating positive sequence harmonic components of the estimated stator flux $\Psi$. In particular it includes performing frequency analysis on the estimated stator flux $\Psi$ and extracting (or calculating) the third, fifth and seventh harmonics positive sequence components. FIG. 4 shows a flow chart of the steps of the first embodiment of the method. FIG. 5, FIG. 6 and FIG. 7 each show the magnitude of one of the harmonics for load unbalance and a stator winding fault against time. As will be apparent, the magnitude of each of these harmonic components differs in the two types of failure.

A threshold can be set for each of the third, fifth and seventh harmonic components. The magnitude of the harmonic component may be compared to the threshold. If the magnitude of at least two of the third, fifth and seventh harmonic components exceed their respective thresholds the fault is classified as a stator winding fault and not as a load unbalance fault. Advantageously requiring two or more of the harmonic components to exceed their respective thresholds provides some confirmation and thereby reduces the possibility of false triggering. As can be seen from the plots, the magnitude of the harmonic component rises or falls over time with increasing stator winding fault severity whereas the harmonic component stays substantially constant over time under load unbalance.

Figure 8:
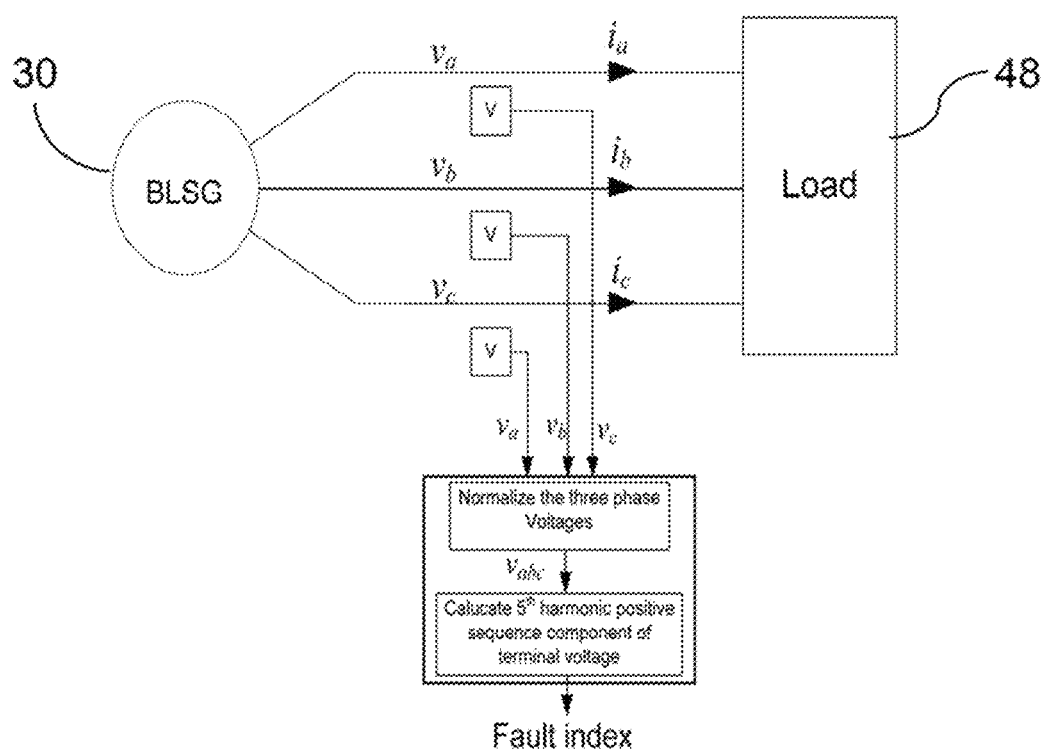
FIG. 8 shows a block diagram of a second embodiment.
Figure 9:
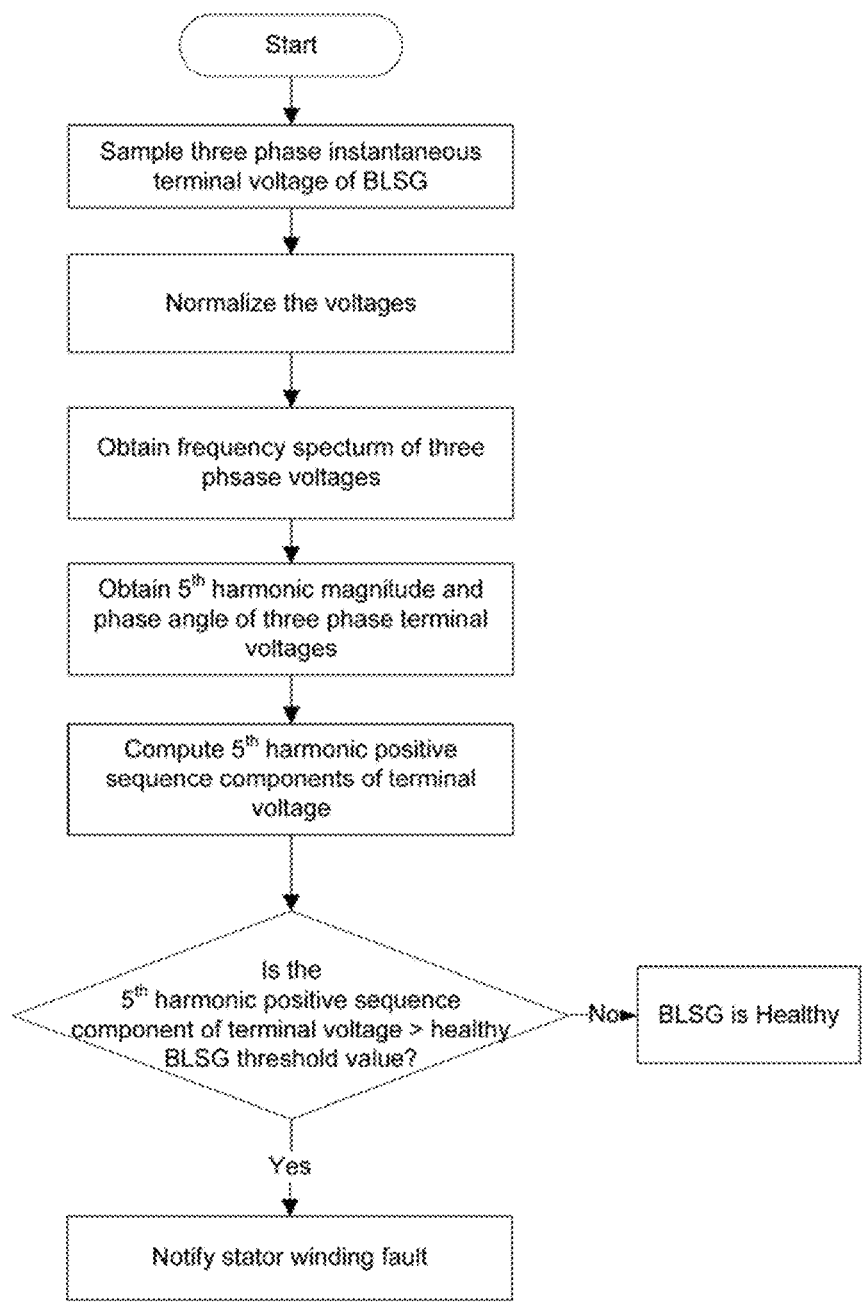
FIG. 9 is a flow chart of a second embodiment of the method.

In a second embodiment the first step comprises measuring the terminal voltage V. FIG. 8 shows a schematic view of a BLSG 30 coupled to a load 48. FIG. 9 is a flow chart of the method according to the second embodiment. Voltage measurements are taken from each of the three phases, shown with suffixes a, b, c. The voltages V are normalised. A frequency spectrum is obtained from the normalised terminal voltage V. The fifth harmonic component of the positive sequence is then obtained or calculated. The fifth harmonic component is then compared to a threshold. If the harmonic component exceeds the threshold then the fault is classified as a stator winding fault and not as a load unbalance fault.

Figure 10:
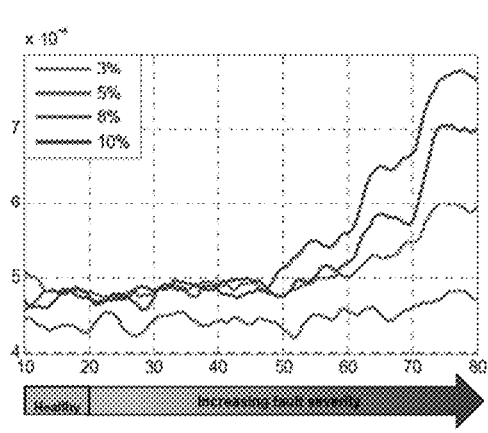
FIG. 10 is a plot of fifth harmonic positive sequence terminal voltage under stator winding short circuit and load unbalance.
Figure 10:
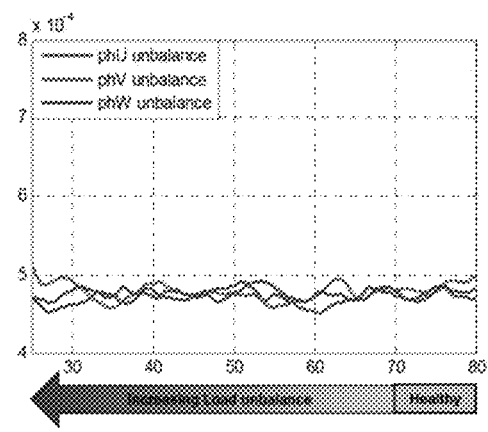

FIG. 10 shows the magnitude of the fifth harmonic positive sequence component for load unbalance and a stator winding fault against time. As will be apparent, the magnitude of the harmonic component differs in the two types of failure.

Alternatively the fifth harmonic component of the positive sequence can be obtained or calculated for each phase. Each of the fifth harmonic components can then be compared to a threshold. If any of the fifth harmonic components exceeds its threshold then the fault is classified as a stator winding fault and not as a load unbalance fault. Extra robustness may be provided by requiring that two or more of the fifth harmonic components exceed their respective thresholds before the fault is classified as a stator winding fault.

Figure 11:
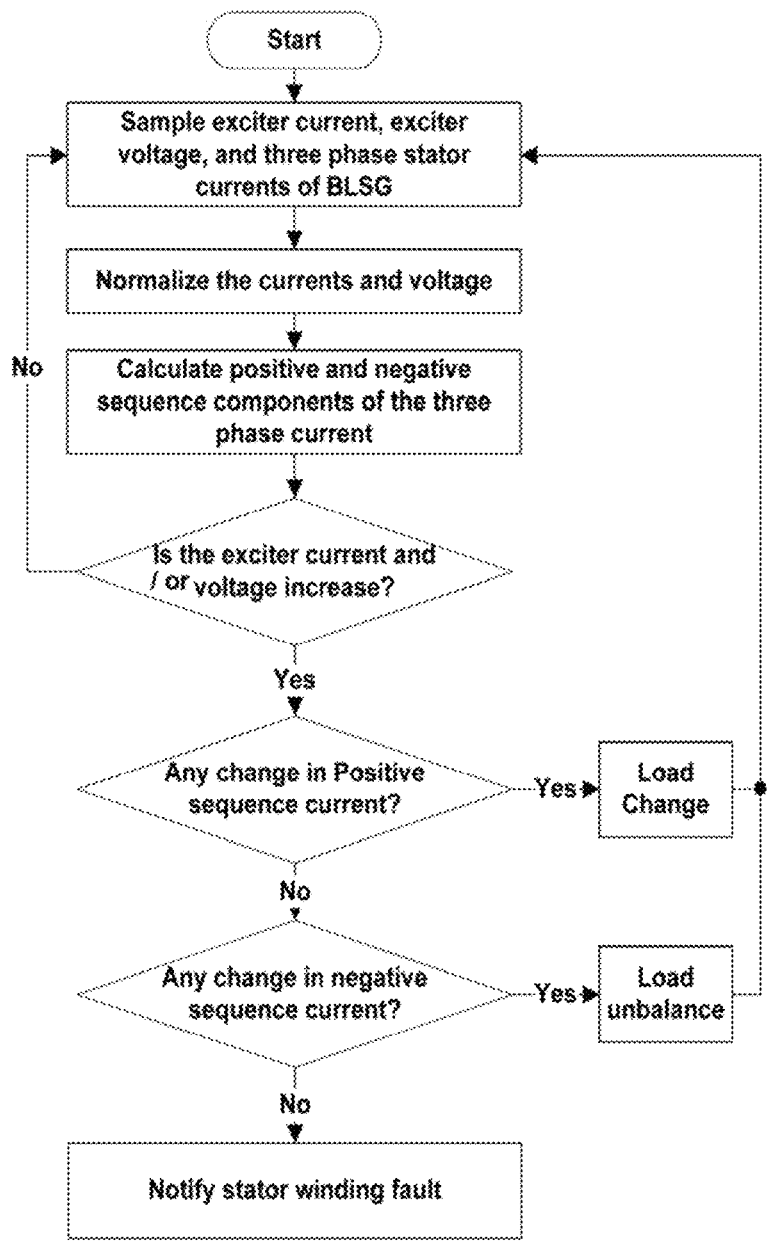
FIG. 11 is a flow chart of a third embodiment of the method.

FIG. 11 is a flow chart of the method according to a third embodiment. In this embodiment the fault is determined by an increase in the current, voltage or both current and voltage of the exciter field winding 32. When a fault has been detected it is classified using current measurement of the stator winding 42. Both the positive sequence harmonic components and the negative sequence harmonic components are extracted using frequency spectrum analysis of the stator currents. If the positive sequence deviates from the normal levels, in conjunction with the detected fault, it indicates a load change. If the negative sequence deviates from the normal levels instead, in conjunction with the detected fault, it indicates a load unbalance. If neither the positive or negative sequences deviate from the normal levels but a fault is detected it is indicated that the fault is a stator winding fault. A threshold range may be set around the normal level of the positive sequence harmonic components and around the normal level of the negative sequence harmonic components. Then the extracted sequences may be compared to the threshold ranges and the stator winding fault be declared if the sequences exceed the threshold ranges.

Figure 12:
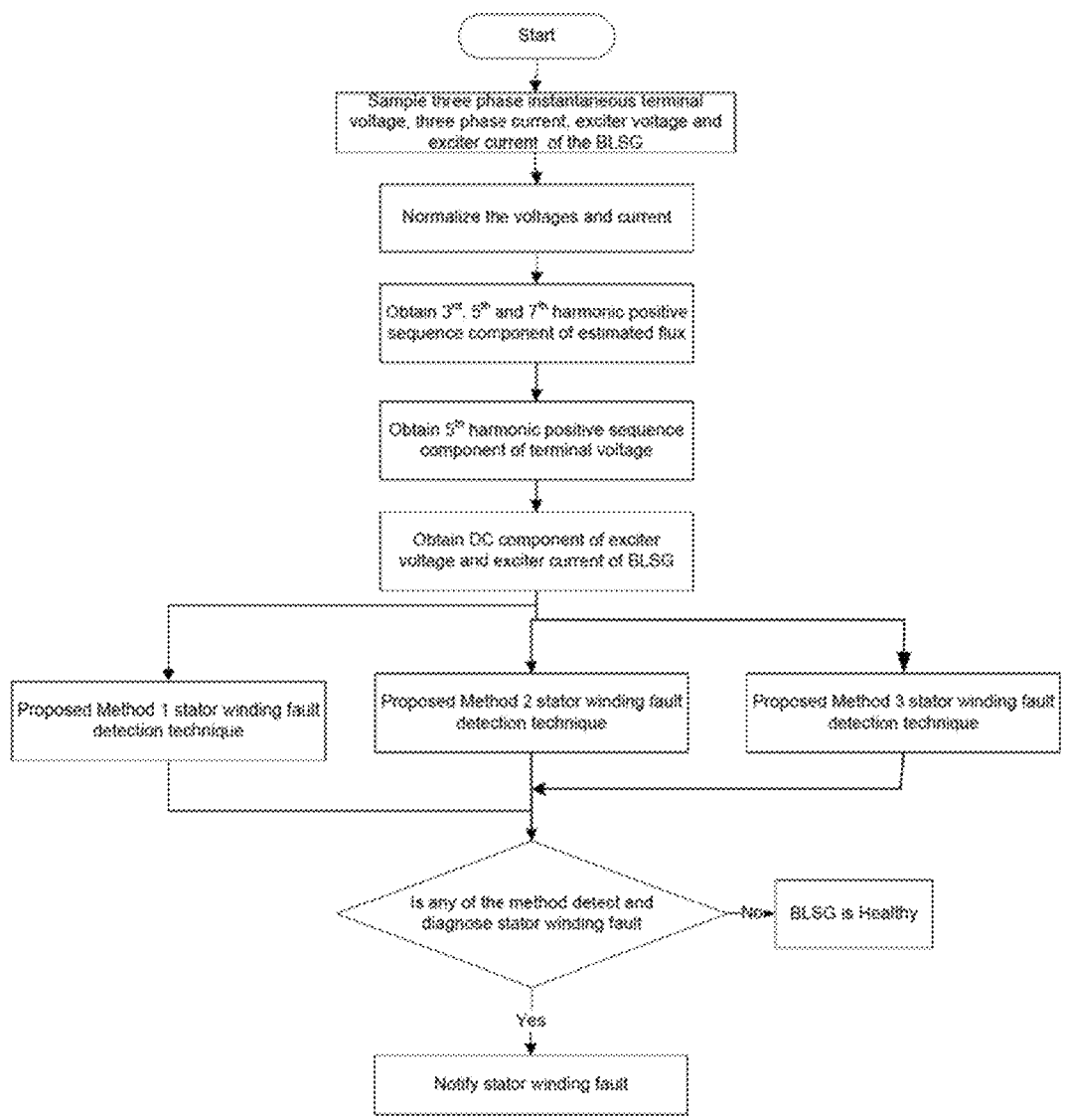
FIG. 12 is a flow chart of a variant of the method.

Two or more of the embodiments may be combined to provide additional robustness to the classification. For example the first and second embodiments of the method may both be used and the stator winding fault only be classified as such if both methods agree, or if one of the embodiments shows such a result. Alternatively the first and third embodiments or the second and third embodiments may be used together. For extra robustness all three embodiments of the method may be used simultaneously as shown in FIG. 12. The method may classify a stator winding fault, as opposed to a load unbalance, if one or more of the embodiments shows such a result.

Advantageously the method described provides differentiation of stator winding faults from load unbalance faults. Advantageously the required sensors are simple current and voltage sensors on the stator components of the BLSG 30. Thus the sensors are not mounted on the rotor or embedded into the BLSG 30 so that it is simple to apply the method to extant generators 30. Advantageously incipient stator winding faults can be detected and classified, as well as established faults. Advantageously only standard frequency analysis is required during use of the BLSG 30. The thresholds may be predetermined.

The method is applicable wherever a BLSG 30 is used. Thus it is applicable for onboard power generation in gas turbine engines 10 used to power aircraft, marine vessels and power plants; in diesel generators for rail, road, industry and residential power; as a shaft generator for hybrid propulsion systems; in electrical machines.

It will be understood that the invention is not limited to the embodiments above-described and various modifications and improvements can be made without departing from the concepts described herein. Except where mutually exclusive, any of the features may be employed separately or in combination with any other features and the disclosure extends to and includes all combinations and sub-combinations of one or more features described herein.

The invention claimed is:

1. A method of classifying a stator winding fault in a brushless synchronous generator comprising:
   measuring current of the stator winding;
   calculating positive harmonic sequence components and negative harmonic sequence components of the measured current;
   comparing the calculated positive harmonic sequence components and the calculated negative harmonic sequence components to a threshold range; and
   classifying the fault if (i) based on the comparing step, neither of the calculated positive harmonic sequence components and the calculated negative harmonic sequence components deviates from the threshold range and (ii) a magnitude of measured exciter field current or exciter field voltage increases.

2. The method as claimed in claim 1 further comprising:
   measuring electrical flux;
   calculating the third, fifth and seventh positive sequence harmonic components of the flux;
   comparing each harmonic component to a threshold; and
   classifying the stator winding fault if at least two of the harmonic components exceed their respective thresholds.

3. The method as claimed in claim 1 further comprising:
   measuring terminal voltage;
   calculating the fifth positive sequence harmonic component of the terminal voltage;
   comparing the fifth harmonic component to a threshold; and
   classifying the stator winding fault if the fifth harmonic component exceeds the threshold.

4. The method as claimed in claim 2 further comprising:
   measuring terminal voltage;
   calculating the fifth positive sequence harmonic component of the terminal voltage;
   comparing the fifth harmonic component to a threshold; and
   classifying the stator winding fault if the fifth harmonic component exceeds the threshold.

5. A method of classifying a stator winding fault in a brushless synchronous generator comprising:
   measuring electrical flux of the stator winding;
   calculating third, fifth, and seventh positive sequence harmonic components of the measured electrical flux;
   comparing each of the calculated third, fifth, and seventh harmonic components to respective thresholds; and
   classifying the stator winding fault if, based on the comparing step, at least two of the calculated third, fifth, and seventh harmonic components exceed their respective thresholds.

6. The method as claimed in claim 5 further comprising:
   measuring terminal voltage;
   calculating the fifth positive sequence harmonic component of the terminal voltage;
   comparing the fifth harmonic component to a threshold; and classifying the stator winding fault if the fifth harmonic component exceeds the threshold.

7. A method of classifying a stator winding fault in a brushless synchronous generator comprising:
measuring terminal voltage of the stator winding;
calculating a fifth positive sequence harmonic component of the terminal voltage;
comparing the calculated fifth harmonic component to a threshold; and classifying the stator winding fault if, based on the comparing step, the calculated fifth harmonic component exceeds the threshold.

8. The method as claimed in claim 3 wherein the terminal voltage comprises a terminal voltage of the stator winding or a terminal voltage of each phase of the stator winding.

9. The method as claimed in claim 4 wherein the terminal voltage comprises a terminal voltage of the stator winding or a terminal voltage of each phase of the stator winding.

10. The method as claimed in claim 6 wherein the terminal voltage comprises a terminal voltage of the stator winding or a terminal voltage of each phase of the stator winding.

11. The method as claimed in claim 7 wherein the terminal voltage comprises a terminal voltage of the stator winding or a terminal voltage of each phase of the stator winding.

12. The method as claimed in claim 1 wherein the step of classifying the fault comprises distinguishing the stator winding fault from a load unbalance.

13. The method as claimed in claim 5 wherein the step of classifying the fault comprises distinguishing the stator winding fault from a load unbalance.

14. The method as claimed in claim 7 wherein the step of classifying the fault comprises distinguishing the stator winding fault from a load unbalance.

15. The method as claimed in claim 1 wherein the stator winding fault comprises any one of a turn-to-turn short circuit; an inter-turn short circuit; a coil-to-coil short circuit; a phase-to-phase fault; and a phase-to-ground fault.

16. The method as claimed in claim 5 wherein the stator winding fault comprises any one of a turn-to-turn short circuit; an inter-turn short circuit; a coil-to-coil short circuit; a phase-to-phase fault; and a phase-to-ground fault.

17. The method as claimed in claim 7 wherein the stator winding fault comprises any one of a turn-to-turn short circuit; an inter-turn short circuit; a coil-to-coil short circuit; a phase-to-phase fault; and a phase-to-ground fault.

\* \* \* \* \*